(12) United States Patent
Adams, III

(10) Patent No.: US 9,523,976 B1
(45) Date of Patent: Dec. 20, 2016

(54) METHOD AND SYSTEM FOR PROCESSING A SEMICONDUCTOR WAFER USING DATA ASSOCIATED WITH PREVIOUSLY PROCESSED WAFERS

(71) Applicant: SPANSION LLC, Sunnyvale, CA (US)

(72) Inventor: Ernest D. Adams, III, Austin, TX (US)

(73) Assignee: Cypress Semiconductor Corporation, San Jose, CA (US)

( * ) Notice: Subject to any disclaimer, the term of this patent is extended or adjusted under 35 U.S.C. 154(b) by 411 days.

(21) Appl. No.: 13/678,255

(22) Filed: Nov. 15, 2012

(51) Int. Cl.
*G05B 19/02* (2006.01)

(52) U.S. Cl.
CPC .................................. *G05B 19/02* (2013.01)

(58) Field of Classification Search
None
See application file for complete search history.

(56) References Cited

U.S. PATENT DOCUMENTS

| | | | |
|---|---|---|---|
| 6,526,547 B2* | 2/2003 | Breiner et al. .................. | 716/56 |
| 6,650,957 B1* | 11/2003 | Campbell ........ | G05B 19/41875 700/110 |
| 6,917,849 B1* | 7/2005 | Pasadyn et al. .............. | 700/121 |
| 2005/0071037 A1 | 3/2005 | Strang | |
| 2006/0265098 A1* | 11/2006 | Gould et al. ................... | 700/121 |
| 2007/0260350 A1* | 11/2007 | Zagrebnov .................... | 700/121 |
| 2007/0282766 A1* | 12/2007 | Hartman et al. ................ | 706/15 |
| 2008/0233662 A1 | 9/2008 | Shen et al. | |
| 2011/0178624 A1* | 7/2011 | Baseman ............... | G06N 5/025 700/104 |

FOREIGN PATENT DOCUMENTS

| | | |
|---|---|---|
| JP | 2004-207703 A | 7/2004 |
| JP | 2007-311581 A | 11/2007 |
| KR | 10-2002-0063295 A | 8/2002 |

OTHER PUBLICATIONS

International Search Report and Written Opinion of the International Searching Authority for International Application No. PCT/US2013/070141, mailed Mar. 10, 2014.
English language abstract for Korean Patent Application Publication No. KR-10-2002-0063295-A (listed on the accompanying form PTO/SB/08A as document FP1).
English language abstract for Japanese Patent Application Publication No. JP-2004-207703-A (listed on the accompanying form PTO/SB/08A as document FP2).
English language abstract for Japanese Patent Application Publication No. JP-2007-311581-A (listed on the accompanying form PTO/SB/08A as document FP3).

* cited by examiner

*Primary Examiner* — Mohammad Ali
*Assistant Examiner* — Bernard G Lindsay

(57) ABSTRACT

A method of processing a wafer in a production tool includes receiving a wafer at a process tool, the wafer associated with a wafer process history, acquiring data associated with wafers processed by the process tool and having the wafer process history, when the amount of acquired data is insufficient, acquiring additional data associated with wafers processed by the process tool and having a process history differing from the wafer process history by a single factor, when the amount of acquired data is sufficient, determining a process parameter using the acquired data, and processing the wafer with the production tool using the process parameter.

18 Claims, 5 Drawing Sheets

US 9,523,976 B1

METHOD AND SYSTEM FOR PROCESSING A SEMICONDUCTOR WAFER USING DATA ASSOCIATED WITH PREVIOUSLY PROCESSED WAFERS

FIELD OF THE DISCLOSURE

This disclosure, in general, relates to systems and methods for controlling semiconductor manufacturing processes.

BACKGROUND

Electronic systems have become ubiquitous in the global marketplace. Nevertheless, manufacturers continue to experience cost pressures. As such, manufacturers struggle with improving yield, lowering device defects, and monitoring device features at each step within the manufacturing process.

In particular, aspects of semiconductor devices, such as critical dimension or relative positioning of components within layers, can influence not only yield, but also performance of the device. Control of such aspects is made more difficult by ever-changing conditions within production tools. Each production tool includes components that can wear or change in performance over time. Further, many manufacturing facilities include a large number of production tools, providing a variety of tool histories that can influence an individual semiconductor wafer.

As such, an improved system or method for controlling semiconductor device production would be desirable.

SUMMARY

In a first aspect, a method of processing a wafer in a production tool includes receiving a wafer at a process tool, the wafer associated with a wafer process history, acquiring data associated with wafers processed by the process tool and having the wafer process history, when the amount of acquired data is insufficient, acquiring additional data associated with wafers processed by the process tool and having a process history differing from the wafer process history by a single factor, when the amount of acquired data is sufficient, determining a process parameter using the acquired data, and processing the wafer with the production tool using the process parameter.

In a second aspect, a semiconductor production system includes a production tool to receive a wafer associated with a wafer process history, a database to store tool history data, and a controller in communication with the production tool and the database. The controller is to acquire data from the database and associate with wafers processed by the production tool and associated with the wafer process history, when the amount of acquired data is insufficient, acquiring additional data from the database and associated with wafers processed by the production tool and having a process history differing from the wafer process history by a single factor, when the amount of acquired data is sufficient, determine a process parameter using the acquired data, and initiate processing of the wafer in the production tool in accordance with the determined processing parameter.

In a third aspect, a semiconductor device formed by a method includes receiving a wafer at a production tool, the wafer associated with a wafer process history, acquiring data associate with wafers processed by the production tool and having the wafer process history, when the amount of acquired data is insufficient, acquiring additional data associated with wafers processed by the production tool and having a process history differing from the wafer process history by a single factor, when the amount of acquired data is sufficient, determining a process parameter using the acquired data, and processing the wafer with the production tool using the process parameter.

In a fourth aspect, a method of processing a wafer in a production tool includes determining whether sufficient first data is available, the first data associated with previously processed wafers process through the same process and processing pathway as the wafer, determining whether sufficient second data is available based at least in part on determining whether sufficient first data is available, the second data associated with previously processed wafers processed through the same process and wherein the processing pathway of the previously processed wafers differ by one tool relative to the processing pathway associated with the wafer, determining a processing parameter based on the first or second data, and initiating processing of the wafer in the production tool in accordance with the determined processing parameter.

In a fifth aspect, a semiconductor production system includes a production tool to receive a wafer, a database to store tool history data, and a controller in communication with the production tool and the database. The controller is to determine whether sufficient first data is available in the database, the first data associated with previously processed wafers process through the same process and processing pathway as the wafer, determine whether sufficient second data is available in the database based at least in part on determining whether sufficient first data is available, the second data associated with previously processed wafers processed through the same process and wherein the processing pathway of the previously processed wafers differ by one tool relative to the processing pathway associated with the wafer, determine a processing parameter of the production tool based on the first or second data, and initiate processing of the wafer in the production tool in accordance with the determined processing parameter.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DESCRIPTION OF THE PREFERRED EMBODIMENT(S)

In an exemplary embodiment, a wafer is received at a production tool, tool history data is accessed, a processing parameter is determined based on the tool history data, and the wafers is processed in accordance with the processing parameter. In an example, the tool history data is accessed from a database. In particular, the tool history data can be associated with the wafer. The wafer, for example, can have been previously processed through various production tools that each behaves slightly differently than other similar production tools within the facility. Such a process history can be used to find historic processing data of other wafers having a similar process history, and such historic processing data can be used to determine processing parameters for use in processing the current wafer. If a sufficient amount of data is not available for determining processing parameters, the search for data can be expanded. In a further example, the processing parameter can be determined by regressing model parameters using the tool history data. In a particular example, regression is performed using a slacked constraint and a least absolute deviation objective function. The constraint can be a function of time, such as a linear function of time. Slack variables within the slacked constraint can be constrained to be greater than or equal to zero. Once the processing parameter is determined, the wafer can be processed based on the processing parameter using the production tool. The processed wafer can then be measured for various characteristics resulting from processing and such measurements can be stored in the database, for example, to be used in relation to subsequent wafer processing.

Figure 1:
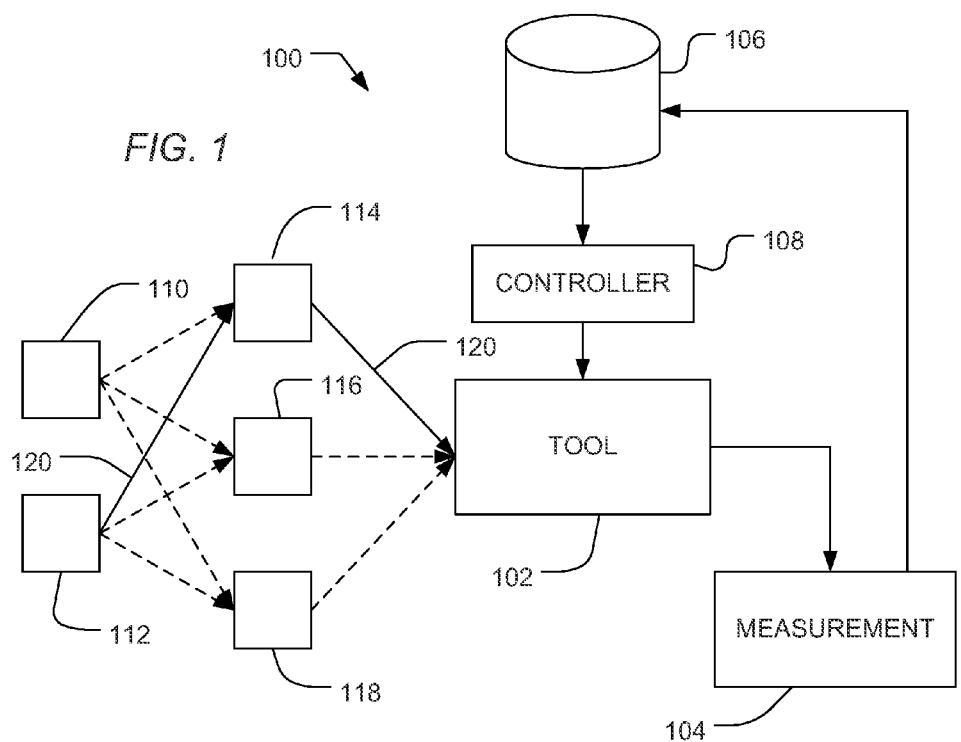
FIG. 1 includes an illustration of an exemplary production system.

In an embodiment, FIG. 1 illustrates an exemplary system 100 for processing a semiconductor device. The system 100 includes a production tool 102, a measurement device 104, a database 106, and a controller 108 in communication with the database 106 and the production tool 102. The measurement device 104 can communicate with the database 106 to store measured data. In another example, the data can be routed to the controller 108, which stores the data in the database 106. In an additional example, the tool 102 can store data in the database 106. In a further example, an equipment interface (EI) in communication with the tool 102 can store data in the database 106.

In an example, a wafer is received at the production tool 102. The controller 108 accesses the database 106 to retrieve tool history data and to determine a processing parameter. The processing parameter is applied to the production tool 102 and the wafer is processed in accordance with the processing parameter. Following processing, the wafer is transferred to the measurement device 104 which measures aspects of the wafer, particularly those influenced by or characteristic of the process associated with the production tool 102. Data measured by the measuring device 104 is stored in the database 106.

In a particular example, each wafer received at the production tool 102 has a particular process history. The process history includes process information and the set of processing tools used to process the wafer prior to its arrival at the production tool 102. For example, a production facility can include a first set of production tools (110 or 112) and a second set of production tools (114, 116, or 118). Depending upon availability, production schedules, the type device being produced, and other factors, a wafer can be processed along a process pathway. An exemplary process pathway 120 includes processing through production tool 112, followed by processing through production tool 114. Other alternative process pathways are illustrated as broken lines. For example, a wafer can be processed through a production tool 110, followed by processing through one of the production tools 114, 116, or 118. In general, the wafer is processed through one production tool of a first set of production tools and subsequently processed through one production tool of a second set of production tools, building a process history. While two sets of production tools are illustrated, a production facility can include many sets of production tools to process wafers.

In a particular example, the controller receives the process history when the wafer is provided to the production tool. The controller 108 can access the database 106 and select data associated with wafers having the same or a similar process history. For example, the data can be associated with wafers having a process pathway the same or similar to that of the wafer received at the production tool. Alternatively, the tool history data can be associated with the last n processed wafers or successfully processed wafers, where n is a number greater than 2, such as between 3 and 20.

In an example, the controller 108 determines one or more production parameters for use by the production tool when processing the wafer. In particular, the controller 108 can regress model parameters based on the tool history data, an objective function, and a set of constraints. In an example, the model parameters are associated with a function of time, such as a linear function time. Such model parameters can be used to determine one or more processing parameters. The controller 108 can apply the processing parameters to the production tool 102, and the production tool 102 can process the wafer in accordance with the production parameter.

Once processed, the wafer can be transferred to a measurement device 104 which measures aspects of the wafer that are characteristic of the processing by the production tool 102. Data provided by the measuring measurement device 104 can be stored in the database 106 along with information about the process history.

Figure 2:
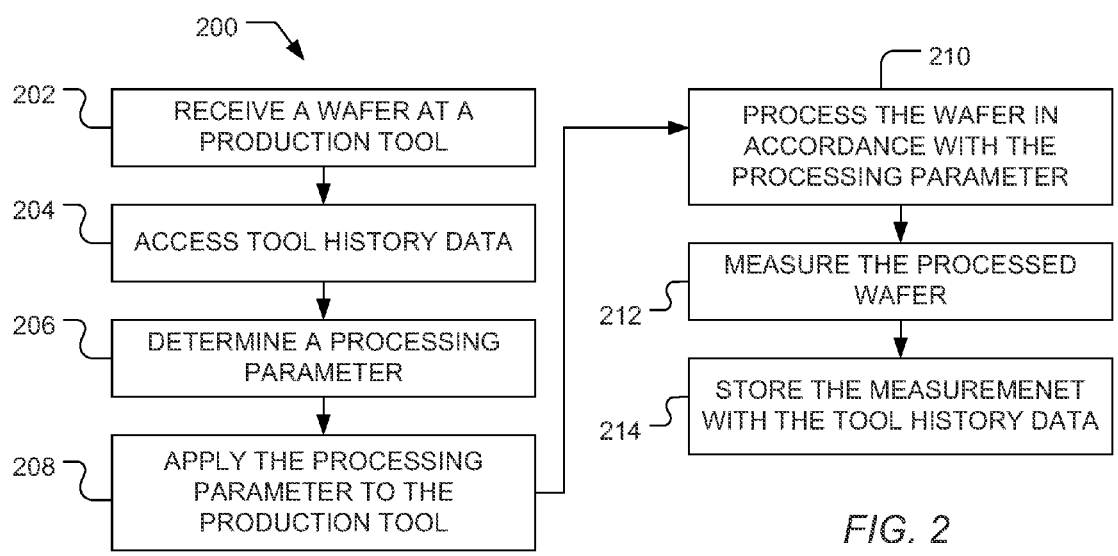
FIG. 2, FIG. 3, and FIG. 4 include flow diagrams illustrating exemplary methods for producing semiconductor devices.

As illustrated in FIG. 2, a method 200 includes receiving a wafer at a production tool, as illustrated at 202. For example, a partially processed wafer including portions of semiconductor devices can be received at a production tool. In addition, the production tool or associated controller can receive a process history associated with the wafer. Such a process history can include information regarding which production tools were used to process the wafer prior to its arrival at the production tool. In addition or alternatively, the process history can include other details regarding the processing parameters, measurements, timestamps, or other data associated with a wafer.

As illustrated at 204, tool history data can be accessed. In an example, a controller can access a database to retrieve select tool history data. In particular, the tool history data can be associated with the wafer. For example, data associated with previously processed wafers having the same process history can be retrieved from the database. The data can include measured observations, processing parameters, wafer history, or other data. In an example, the controller can retrieve data associated with a set of recently processed wafers having a similar process history. The controller can limit the set to a preset number of previously processed wafers. For example, the controller can be configured to select the most recent n wafers having a similar history, the most recent n wafers meeting specific criteria, or the most recent n wafers having measured data, where n is a number greater than 2, such as 3, 4, 5, 6, 8, 10, 20, or more. If the amount of data, e.g., number of wafers, is not sufficient, for example, less than n, the search for data can be expanded to include process histories that are similar.

In particular, when selecting data for use in determining a processing parameter, the controller can filter the data, identifying values that are outside of an expected range. Such values can be excluded or reduced in weight in a regression object function. In an example, the filter utilizes a box filter. A box filter defines upper or lower bounds outside of which data is excluded or the weighting of such data within the objective function of a regression is adjusted downward to limit the influence of such fliers on the regression of the model parameter. The upper or lower bounds can be preset values, can be determined based on deviations relative to a mean or median, or can be determined based on set percentiles.

The processing parameter can be determined, as illustrated at 206, based on the selected tool history data. For example, model parameters can be regressed using the tool history data, and such model parameters can be used to determine the processing parameter.

In an example, the model parameters are regressed from the selected tool history data based on an objective function and a set of constraints. In an example, the objective function is a Least Difference (LD) objective function or a Least Absolute Deviation (LAD) objective function. In such an example, the objective function, as expressed below, seeks the minimum absolute difference between an observed value ($y_i$) and a value predicted by a function ($f(x_i)$) of the processing parameters ($x_i$).

$$\min \sum_{i=1}^{n} |y_i - f(x_i)|$$

The objective function can be weighted, for example, emphasizing more recent data in the regression algorithm. The weight ($w_i$) in the equation below can be selected to emphasize more recent data. In an example, the weight within the objective function can be the index (i), in which more recent data has a greater index. In another example, the weight can be proportional to time, wherein time is expressed in a manner discussed below. In a further example, the weight can be adjusted based on whether a data point is considered a flier (an unacceptably high or low value).

$$\min \sum_{i=1}^{n} w_i |y_i - f(x_i)|$$

The function ($f(x_i)$) can be a polynomial expression in terms of the processing parameter ($x_i$). Some of the parameters of the function ($f(x_i)$) can be representative of the physical system and thus, are invariant. Other parameters of the function ($f(x_i)$) can vary with changes in the system. Parameters that vary with changes in the system can be further represented by a function with parameters that are determined through regression.

In a particular example, the function ($f(x_i)$) is a linear function (first degree polynomial) of the processing parameter, including a slope (m) and an intercept (b). In such an example, the linear function of the processing parameter provides a predicted observation that can be compared to a measured observation. For example, the observation can be the Develop Inspect Critical Dimension (DICD) and the processing parameter can be exposure. In another example, such a function ($f(x_i)$) can be used for comparing observed positioning or overlay relative to adjustments in position made by the production tool. Alternatively, a function of the processing parameter can be used in relation to a variety of observation and processing parameter pairs.

$$\min \sum_{i=1}^{n} |y_i - (b + mx_i)|$$

An example of a linear function in terms of a processing parameter ($x_i$) includes a slope (m) and intercept (b). While generally the function of the processing parameter can include model parameters that remain static with time, use of the processing tool can result in a changing functionality of the production tool. For example, continued use of lamps or lasers associated with the production tool can result in degradation of a lamp or laser over time. In another example, use of a production tool can loosen components used to control overlay.

To compensate for changing functionality of the production tool, a parameter of the linear function of the processing parameter, such as the intercept (b), can be modeled as a function of time, accounting for changes in the production tool. In an example, the intercept can be modeled as a linear function of time, as illustrated below.

$$b = a_0 + a_1 t_i$$

As used herein, time ($t_i$) can be expressed as real time, an index based on use, such as a counter of previously processed wafers, an index of the wafers within the set of wafers comprising the tool history data, a counter of a number of days, hours, minutes, or seconds of tool use, or other measures that have real or implied temporal aspects.

In addition, the regression can utilize constraints, such as the constraint identified below. The residual ($r_i$) is the difference between the observed value ($y_i$) and a value predicted by a function ($f(x_i)$). The residual ($r_i$) plus a function of time is equal to the intercept. In other words, the predicted output plus the residual should equal the actual output.

$$r_i + (a_0 + a_1 t_i) = b_i$$

To facilitate acquisition of a solution and given that there is uncertainty in the sign (positive or negative) of the slope and the intercept, slack variables are utilized within the constraints and objective function. Such slack variables can be constrained to be greater than or equal to zero. As used herein, use of slack variables within a constraint or objective function of a model parameter regression is referred to as a slacked regression, and constraints and objective functions including slack variables are referred to herein as slacked constraints or slacked objective functions. In an example, a slacked constraint can include first and second slope variables ($a_{11}$ and $a_{21}$) in which the second slope variable ($a_{21}$) is subtracted from the first slope variable ($a_{11}$) to define a slope ($a_1$). Similarly, a constraint can include first and second residuals ($r_{1i}$ and $r_{2i}$) and first and second intercepts ($a_{10}$ and $a_{20}$) where the second ($r_{2i}$ or $a_{20}$) is subtracted from the first ($r_{11}$ or $a_{10}$) to define a total value ($r_i$ or $a_0$). When using constrained slack variables, one of the first or second slack variable is regressed to be zero and the other can have a non-zero positive value.

$$(r_{1i} - r_{2i}) + ((a_{10} - a_{20}) + (a_{11} - a_{21}) t_i) = b_i$$

$$a_0 = a_{10} - a_{20}$$

$$a_1 = a_{11} - a_{21}$$

$$r_{1i}, r_{2i}, a_{10}, a_{20}, a_{11}, \text{ and } a_{21} \geq 0$$

When utilizing such slack variables, a least absolute deviation (LAD) objective function becomes the sum of the first and second residuals ($r_{1i}$ and $r_{2i}$).

$$\min \sum_{i=1}^{n} (r_{1i} + r_{2i})$$

In a further example, the resulting processing parameter can be constrained to limit flier values (values higher or lower than desired) that can lead to poor production. For example, the resulting processing parameter can be constrained based on an allowed range. In particular, the range can be an Intraquartile Range (IQR), which is a middle percentage of the distance between the largest and smallest data point, such as the middle 50% derived from values of a data set. The IQR can be multiplied by a factor (f), for example 1.0, to determine the full range that the controller can move. In particular, a constraint can be implemented as an inequality constraint based on a last "good" day (Last Value), where "good" days or instances are defined as a day or instance not identified by the box filter as a flier. Assuming the last good day or instance is also the last day or instance of the data set (expressed as $t_n$), an inequality constraint can be constructed.

$$\begin{bmatrix} 1 & -1 & t_n & -t_n \\ -1 & 1 & -t_n & t_n \end{bmatrix} \begin{bmatrix} a_{10} \\ a_{20} \\ a_{11} \\ a_{21} \end{bmatrix} \leq \begin{bmatrix} \text{Last Value} + f*IQR \\ \text{Last Value} - f*IQR \end{bmatrix}$$

In a further example, the processing parameter can also be constrained based on the minimum change. For example, when the determined processing parameter ($x_{i+1}$) does not change by a minimum amount ($\Delta x_{min}$) relative to a previous value ($x_i$) identified by the constraints, the last value of the processing parameter is utilized instead of the determined processing parameter.

$$|x_{i+1} - x_i| \geq \Delta x_{min}$$

Once the model parameters are determined through regression and a target observed value (y) is specified, the processing parameter (x) can be determined, for example, by inverting the function ($f(x_i)$).

Returning to FIG. 2, once a processing parameter is determined, the processing parameter can be applied to the production tool by the controller, as illustrated at 208. For example, the controller can adjust the processing tool in accordance with the processing parameter. The wafer is processed in accordance with the processing parameter by the production tool, as illustrated at 210.

Following processing, the processed wafer can be measured for characteristics indicative of the processing by the production tool, as illustrated at 212. For example, when the processing parameter is an exposure, a critical dimension can be measured by a measuring device. When the processing parameter is associated with a positioning or an adjustment of a position of a wafer, the measurement device can measure errors in overlay.

Once the measurement is made, the measurement data along with tool history data associated with the wafer can be stored in a database, as illustrated at 214. Such data can include the measured value, the processing parameter applied to process the wafer, or wafer history data, among other data. Such data can be used to assist in determining processing parameters for processing subsequent wafers.

Figure 3:
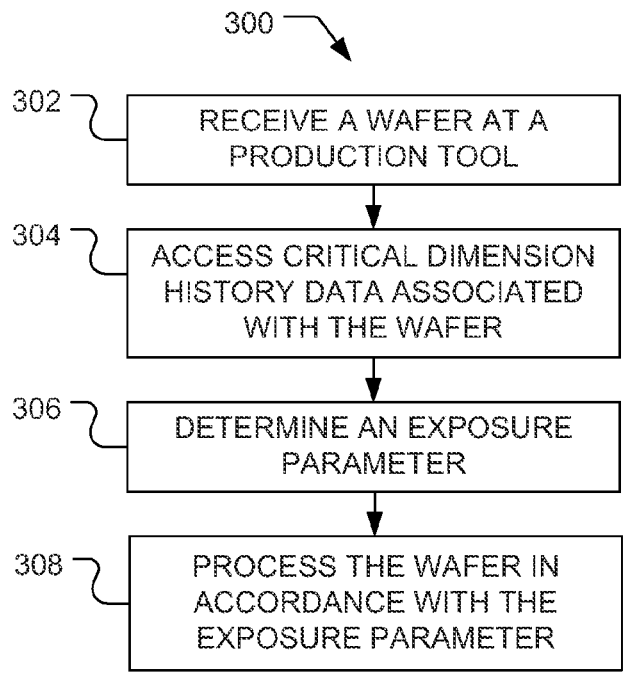

In a particular example, such a system can be utilized to determine exposure when processing a wafer. For example, as illustrated in the method 300 of FIG. 3, a wafer can be received at a production tool, as illustrated at 302. The critical dimension history data can be accessed, as illustrated at 304. In particular, the critical dimension history data can be associated with a wafer. For example, the selected critical dimension history data can be selected based on similar wafer histories.

When the Develop Inspect Critical Dimension (DICD) is modeled as a linear function of exposure in which y represents the proportional relationship between critical dimension and exposure, the intercept ($\hat{d}$) can further be modeled as a function of time. For example, $\hat{d}$ can be modeled as a linear function of time.

$$DICD = \gamma * \text{Exposure} + \hat{d}$$

$$\hat{d} = *t_i + a_0$$

In particular, such a model can compensate for degradation of radiation sources over time. Utilizing a slacked regression including a slacked objective function and a slacked constraint, the exposure parameter can be determined based on the critical dimension history data, as illustrated at 306. Optionally, the slacked objective function can be weighted using the index (i) as the weight.

Once the exposure parameter is determined, a wafer can be processed in accordance with the exposure parameter, as illustrated at 308. The wafer can further be measured for critical dimension, and the measured critical dimension data stored along with exposure parameters and wafer history data for later use in determining exposure parameters for subsequent wafers having a similar process history.

Figure 4:
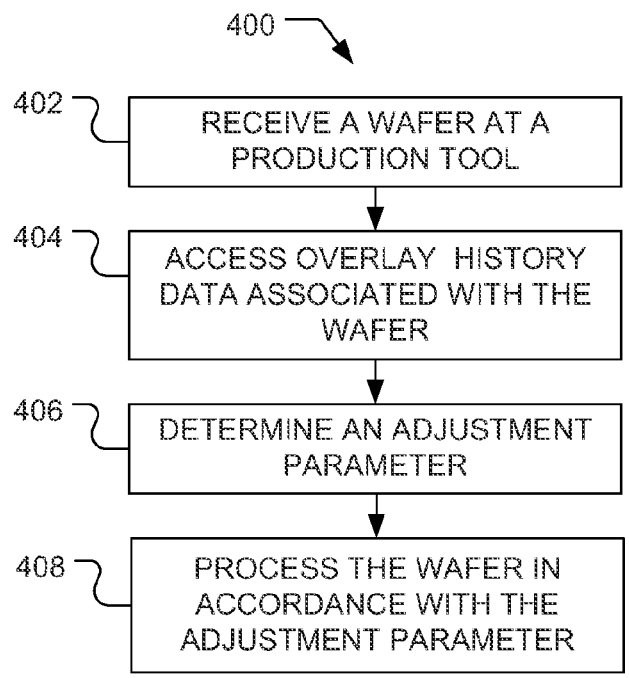

In a further example, adjustment parameters can be determined to improve overlay. For example, as illustrated in the method 400 of FIG. 4, a wafer can be received at a production tool, as illustrated at 402. Overlay history data associated with wafer can be accessed, as illustrated at 404. Such overlay history data can be used to determine an adjustment parameter, as illustrated at 406. The determined adjustment parameter can be applied to the production tool, and the wafer can be processed in accordance with the adjustment parameter, as illustrated at 408. Errors in overlay can be subsequently measured and stored along with adjustment parameter and wafer history data in a database for subsequent use in determining adjustment parameters for processing subsequent wafers having a similar process history.

As used herein, the terms "least" or "minimum" are used to mean a lower value determined in the context of a regression or a relatively lower value. Various regression algorithms can yield different "minimum" values. However, in the minimizing process, desirable regression algorithms provide a lower value than an initiated value or an initial value. In addition, the terms "most" or "maximum" refer to a higher value in the context of regression or a relatively higher value. Various regression algorithms can yield different results, but a desirable regression algorithm provides a higher value than an initial value when seeking a "maximum" value.

In particular, the above methods for generating processing parameters rely on tool history data of the tool using the processing parameters. The tool history data includes entries associating processing of a wafer and the wafer's process history. The process history can include information about the process and the process pathway through which a wafer is processed. The process relates to information about masking or other process variables, such as processing parameters, measurements, timestamps, or other data associated with the wafer. The process pathway can include the specific process tools through which a wafer is processed and the order through which the wafer is processed through the specific process tools. In an example, a portion of the tool history data can be selected for determining the processing parameter. The effect a tool has on a wafer can depend on the wafer's process history. For example, a wafer processed through a particular process using a particular set of processing tools may be more accurately processed through the production tool when the processing parameters are determined using a subset of the tool history data that more particularly approximates the process history of the particular wafer to be processed.

For example, the intercept (b) described above can be considered the sum of influences of each of the processing tools through which a particular wafer has been processed. Rather than determining the contribution of each processing tool in a wafers process history to the intercept (b), tool history data of wafers processed through the same or a similar process history can be utilized to determined parameters of a function yielding the intercept (b). As such, the system may select tool history data associated with wafers having the same process history as that of the wafer to be processed. In such a manner, the influence of the process history on the process parameters for the particular tool can be incorporated into the parameters utilized for processing the wafer.

To determine the process parameters and accurately account for aspects of the process history, the system may seek a sufficient amount of data before determining the parameters. At a minimum, a number of historical samples acquired from the tool history should be at least as many as the number of regressed parameters (e.g., $a_i$) used by the above methods to determine the processing parameter. Improved accuracy may be achieved by including more than the minimum amount of data at the expense of the processing time. To maintain an efficient process having a desired level of accuracy, a user may set the number of samples deemed sufficient.

When the amount of data associated with wafers having the same process history as the wafer to be processed is not sufficient, the system can seek data that is associated with wafers that have a similar process history to the wafer to be processed. In an example, such similar process history may differ by one factor. An exemplary factor includes use of one different process tool in a similar process to that process experienced by the wafer.

When the amount of data is sufficient after performing a search for data associated with wafers having a similar process history, the tool history data can be used to determine the process parameters. In an example, the data utilized can be the cumulative data found from both searching for tool history data associated with wafers having the same process history and associated with wafers having a similar process history having a single factor difference. Alternatively, the system can utilize only the data found through searching for tool history data associated with wafers having a similar process history that differs by a single factor.

When a search for data associated with wafers having the same process history and having a process history that differs by a single factor provides an insufficient amount of data, the search for data can be expanded to include data associated with wafers having a process history that differs by two factors, or three factors, etc., until a sufficient amount of data is found. In another example, the tool history data can be searched for data associated with wafers following the same process with different tools. In an additional example, data associated with wafers processed by the tool regardless of process history can be selected. When the production tool itself is new, the system may search for data associated with wafers having the same or similar process histories that are processed on a different tool similar to the production tool receiving the wafer.

Figure 5:
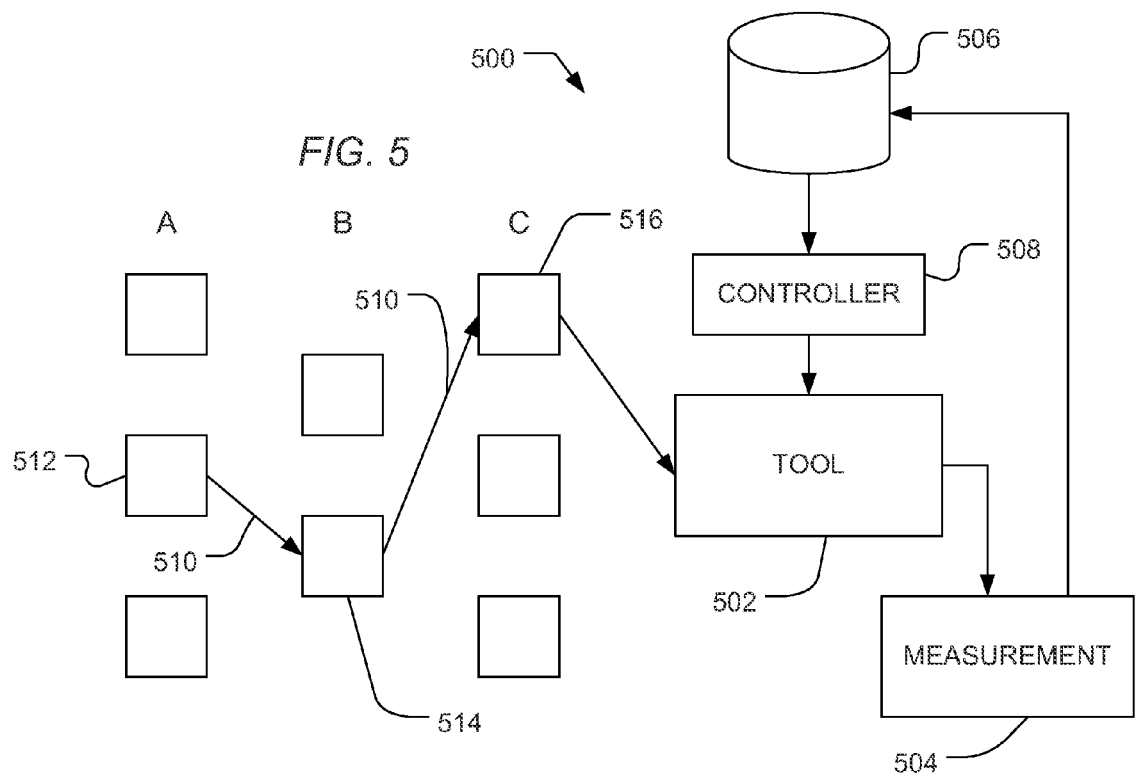
FIG. 5, FIG. 6, and FIG. 7 include illustrations of exemplary processes and exemplary process pathways.

FIG. 5 includes an illustration of an exemplary system 500 in which a wafer to be processed by a production tool 502 has undergone a process history. A controller 508 retrieves data from a database 506 and utilizes the data from the database 506 to provide process parameters to the tool 502. Once a wafer is processed, characteristics of the processed wafer are measured at 504 and the data associating the measurement with the wafer and the wafer's process history are stored in the database 506. In the illustrated example, the process history includes a pathway 510 in which the wafer is processed at a processing tool 512 of type A, processed at a processing tool 514 of type B, and processed at a tool 516 of type C. The controller 508 may seek data from the database 506 associated with wafers processed through the same process history 510, i.e., processed through the same process by tools 512, 514, and 516.

Figure 6:
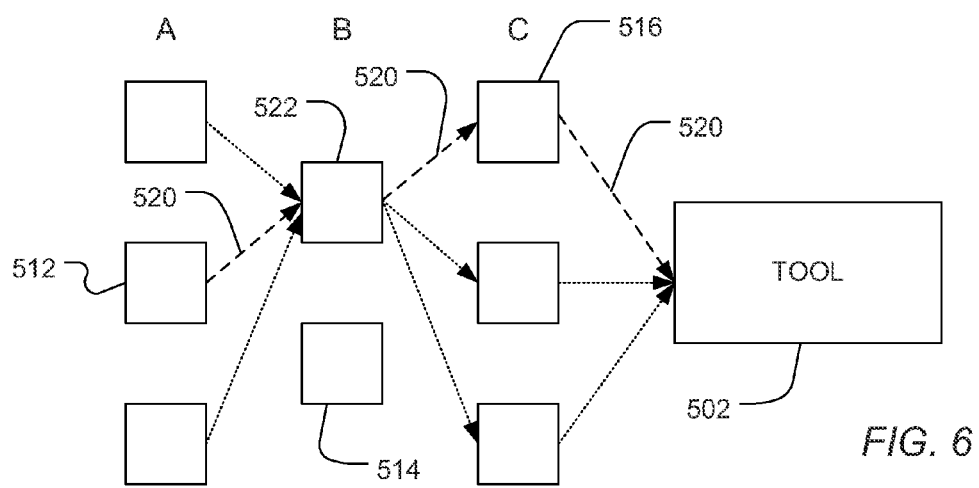

In the event that the amount of acquired data is insufficient to determine the parameters, additional data may be sought by searching for data associated with wafers having a process history that differs by a single factor. Such a single factor can be the use of a different processing tool of the same type following the same process. For example, FIG. 6 illustrates a process pathway 520 in which the process utilizes processing tool 512 of type A and processing tool 516 of type C, but uses processing tool 522 of type B instead of processing tool 514. When sufficient data is found by expanding the search to include data associated with wafers having a process history that differs by a single factor, the processing parameters can be determined and the wafer processed in accordance with the processing parameters by the production tool 502.

When the amount of data is insufficient for determining the parameters, the search for data can be expanded to include data associated with wafers having a similar process history that differs by two factors or more. In another example, data associated with wafers following a similar process (indicated by the shorter dashes in FIG. 6) regardless of which pathway is utilized can be selected and used to determine the processing parameters. Such data can be combined with the data associated with wafers having the same process history and wafers having a similar process history that differs by a single factor.

Figure 7:
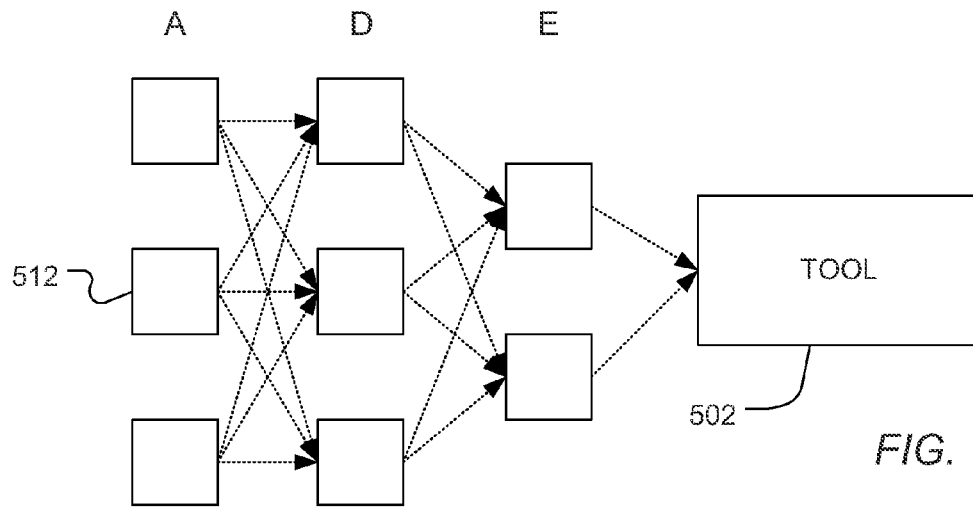

In the event that the amount of data associated with wafers having the same process regardless of processing pathway is insufficient for determining parameters, data from wafers associated with different processes can be utilized to determine the parameters for use by the tool 502. An insufficient amount of data may result when a new process is introduced. For example, FIG. 7 includes an illustration in which a process history includes a processing tool of type A and can use processing tool 512. However, the process differs by using other types of processing tools D and E. In such an example, data associated with wafers having the same process history, having a process history that differs by a single factor, data associated with wafers having a process history that differs by two factors, and data associated with wafers processed by the production tool 502 following a different process can be combined to provide sufficient data for determining parameters for use by production tool 502.

Figure 8:
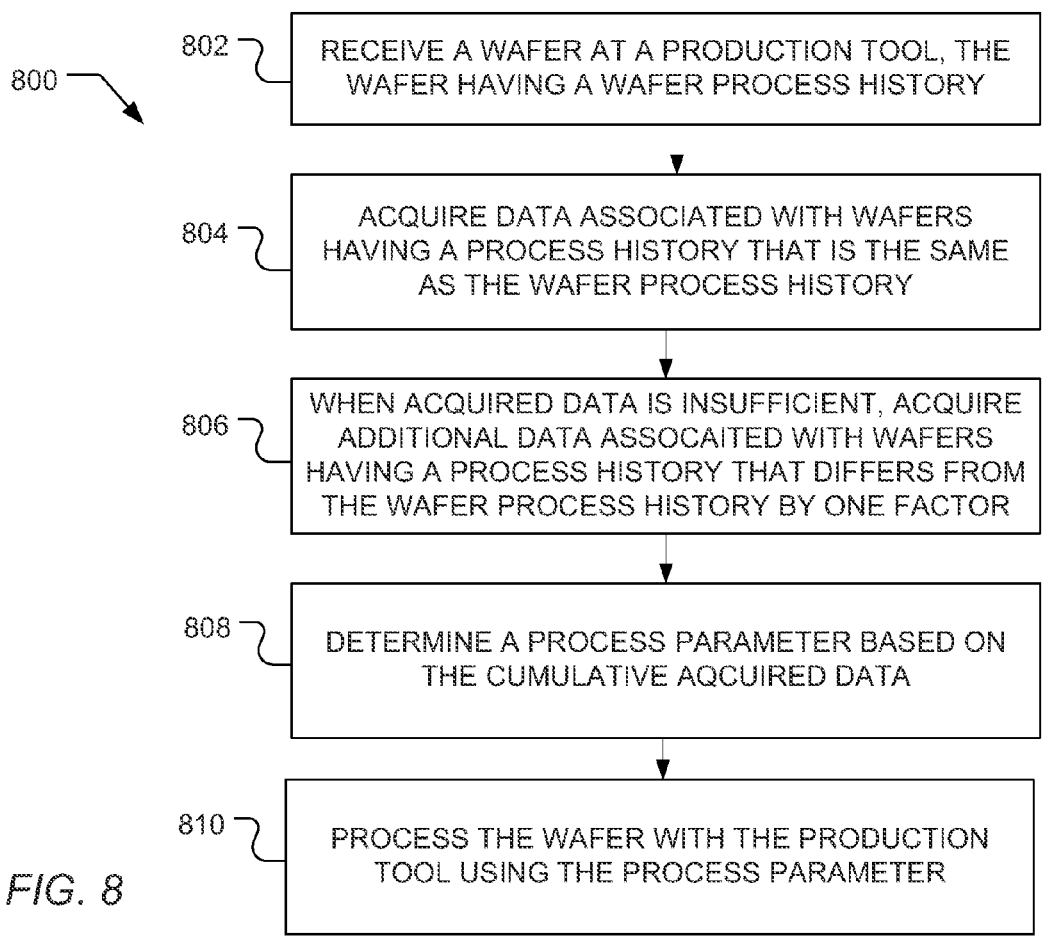
FIG. 8 and FIG. 9 include flow diagrams illustrating exemplary methods for producing semiconductor devices.

In an example illustrated in FIG. 8, a wafer is received at a production tool along with a wafer process history associated with the wafer, as illustrated at 802. A controller associated with the production tool acquires data from a database. The data can be associated with wafers having a process history that is the same as the wafer process history, as illustrated at 804. Such data can be used to determine a processing parameter when a sufficient number of entries are available for use in determining process parameters. In a well-established process using frequently used processing tools, a sufficient amount of data is likely to be found.

When the amount of acquired data is insufficient, additional data can be acquired from the database, as illustrated at 806. The additional data can be associated with wafers having a process history that differs from the wafer process history by one factor. For example, when a new processing tool of a type similar to existing processing tools is introduced into the process, an insufficient amount of data associated with that particular processing tool and pathways extending through that processing tool is available. When the amount of data acquired from a search for wafers having the same process history or wafers having a similar process history is insufficient, additional searches can be performed, for example, through a hierarchy of expanded searches. For example, the additional data can be acquired by searching for data associated with wafers having a process history that differs from the wafer process history by two factors, three factors, etc. In another example, the search can be performed for data associated with wafers processed by the specific production tool for a different process from that forming the wafer.

When a sufficient amount of data is acquired, the processing parameter can be determined based on the cumulative data acquired through searching, as illustrated 808. The wafer received at the production tool can be processed using the processing parameter, as illustrated 810.

Figure 9:
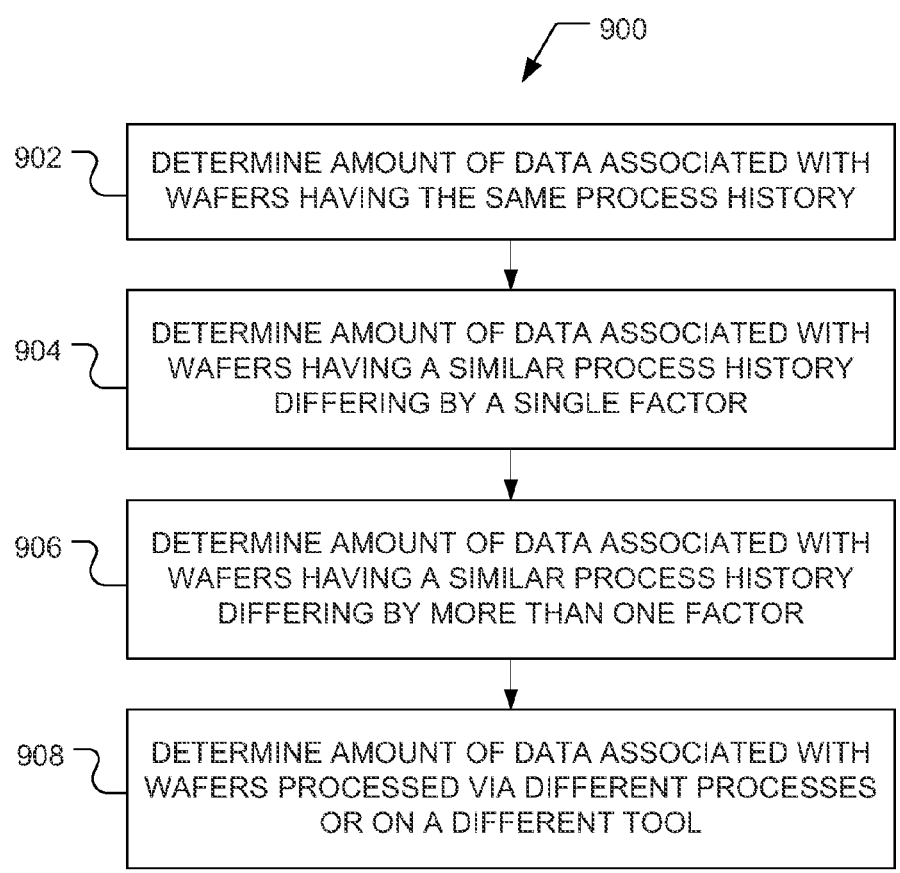

In particular example illustrated in FIG. 9, a method 900 includes determining an amount of data associated with wafers having the same process history. Such data is associated with wafers that are processed using the same process and the same processing pathway.

When the data is insufficient for determining process parameters associated with the tool, the system can determine an amount of data associated with wafers having a similar process history, for example, processed by the same process through a pathway differing by a single tool, as illustrated 904.

In the event that the amount of data is insufficient, the system can further expand the search for data. For example, the system can determine an amount of data associated with wafers having a similar process history that differs by more than one factor, such as having a pathway that differs by more than one processing tool, as illustrated 906.

In the event that such an amount of data proves insufficient for determining the process parameters associated with the tool for use by the tool, the system can expand the search further. For example, the system can determine an amount of data associated with wafers processed by different processes but processed by the same tool, as illustrated 908. Alternatively, when the amount of data proves insufficient, data can be selected from data processed by the process tool associated with wafers of having different process histories and processed through different processes.

In each of the above steps, once a sufficient amount of data is acquired cumulatively, the process parameters for use by the processed tool can be determined. The wafer can be processed by the process tool. The resulting wafer can be characterized and such characterized wafer data can be stored in a database for use by the controller of the process tool when processing subsequent wafers.

Critical Dimension Example

Utilizing a linear model of critical dimension relative to exposure as described above, in which the intercept ($\hat{d}$) is represented by a linear function of time, and utilizing a slacked LAD objective function and slacked constraints as described above, the data of Table 1 is used to regress the parameters of the linear function of time. Time is expressed as an index of the data in which more recent data has a higher index value.

TABLE 1

Critical Dimension Historical Data

| Time (Index) | DICD | Exposure (mJ) | Gamma | $\hat{d}$ |
|---|---|---|---|---|
| 1 | 0.081 | 45.1 | 0.001 | 0.0359 |
| 2 | 0.080 | 45.1 | 0.001 | 0.0349 |
| 3 | 0.079 | 45.1 | 0.001 | 0.0339 |

When utilizing an unweighted slacked LAD objective function, regression yields a slope of $-0.001$ and an intercept of 0.0369 for the linear function of time. Projecting a fourth data point for use in determining the processing parameter, $\hat{d}$ is determined to be 0.0329. Assuming a target DICD of 0.080, the exposure is determined to be 47.1 mJ.

In a first aspect, a method of processing a wafer in a production tool includes receiving a wafer at a process tool, the wafer associated with a wafer process history, acquiring data associate with wafers processed by the process tool and having the wafer process history, when the amount of acquired data is insufficient, acquiring additional data associated with wafers processed by the process tool and having a process history differing from the wafer process history by a single factor, when the amount of acquired data is sufficient, determining a process parameter using the acquired data, and processing the wafer with the production tool using the process parameter.

In an example of the first aspect, the method further includes, when the amount of acquired data is insufficient following acquiring additional data, acquiring data associated with wafers processed by the production tool and having a process history differing from the wafer process history by two factors.

In another example of the first aspect and the above examples, the method further includes, when the amount of acquired data is insufficient following acquiring additional data, acquiring data associated with wafers processed by the production tool and having a process history associated with a different process.

In a further example of the first aspect and the above examples, the method further includes, when the amount of acquired data is insufficient following acquiring additional data, acquiring data associated with wafers processed by a different production tool. In an example, the wafers processed by a different production tool have the same process history.

In an additional example of the first aspect and the above examples, the acquired data includes critical dimension data and wherein the processing parameter includes an exposure parameter.

In another example of the first aspect and the above examples, the acquired data includes overlay history data and wherein the processing parameter includes a position adjustment parameter.

In a further example of the first aspect and the above examples, determining the processing parameter includes determining the processing parameter based at least in part on a regression of model parameters using the acquired data and utilizing a least absolute deviation objective function. In an example, the regression is a slacked regression. In a further example, the least absolute deviation objective function is a weighted least absolute deviation objective function. In another example, the regression utilizes a model that is a function of time, the model parameters associated with the function of time. For example, the model is a linear model having an intercept, the intercept being a function of time.

In an additional example of the first aspect and the above examples, acquiring data includes querying a database and comparing the number of records returned with a threshold.

In a further example of the first aspect and the above examples, acquiring additional data includes querying a database and comparing the sum of the number of records in the acquired data and the number of records returned as the additional data with a threshold.

In a second aspect, a semiconductor production system includes a production tool to receive a wafer associated with a wafer process history, a database to store tool history data, and a controller in communication with the production tool and the database. The controller is to acquire data from the database and associate with wafers processed by the production tool and associated with the wafer process history, when the amount of acquired data is insufficient, acquiring additional data from the database and associated with wafers processed by the production tool and having a process history differing from the wafer process history by a single factor, when the amount of acquired data is sufficient, determine a process parameter using the acquired data, and initiate processing of the wafer in the production tool in accordance with the determined processing parameter.

In an example of the second aspect, the controller is to, when the amount of acquired data is insufficient following acquiring additional data, acquire data associated with wafers processed by the production tool and having a process history differing from the wafer process history by two factors.

In another example of the second aspect and the above example, the controller is to, when the amount of acquired data is insufficient following acquiring additional data, acquire data associated with wafers processed by the production tool and having a process history associated with a different process.

In a further example of the second aspect and the above example, the controller is to, when the amount of acquired data is insufficient following acquiring additional data, acquire data associated with wafers processed by a different process tool.

In an additional example of the second aspect and the above example, the acquired data includes critical dimension data and wherein the processing parameter includes an exposure parameter.

In another example of the second aspect and the above example, the acquired data includes overlay history data and wherein the processing parameter includes a position adjustment parameter.

In a further example of the second aspect and the above example, determining the processing parameter includes determining the processing parameter based at least in part on a regression of model parameters using the acquired data and utilizing a least absolute deviation objective function.

In an additional example of the second aspect and the above example, acquiring data includes querying the database and comparing the number of records returned with a threshold.

In a third aspect, a semiconductor device formed by a method includes receiving a wafer at a production tool, the wafer associated with a wafer process history, acquiring data associate with wafers processed by the production tool and having the wafer process history, when the amount of acquired data is insufficient, acquiring additional data associated with wafers processed by the production tool and having a process history differing from the wafer process history by a single factor, when the amount of acquired data is sufficient, determining a process parameter using the acquired data, and processing the wafer with the production tool using the process parameter.

In a fourth aspect, a method of processing a wafer in a production tool includes determining whether sufficient first data is available, the first data associated with previously processed wafers process through the same process and processing pathway as the wafer, determining whether sufficient second data is available based at least in part on determining whether sufficient first data is available, the second data associated with previously processed wafers processed through the same process and wherein the processing pathway of the previously processed wafers differ by one tool relative to the processing pathway associated with the wafer, determining a processing parameter based on the first or second data, and initiating processing of the wafer in the production tool in accordance with the determined processing parameter.

In an example of the fourth aspect, the method further includes selecting third data based at least in part on determining whether sufficient second data is available, the third data associated with previously processed wafers processed through the same process and wherein the processing pathway of the previously processed wafers differ by more than one tool relative to the processing pathway associated with the wafer.

In another example of the fourth aspect and the above examples, the method further includes selecting third data based at least in part on determining whether sufficient second data is available, the third data associated with a set of previously processed wafers regardless of process.

In an additional example of the fourth aspect and the above examples, the method further includes receiving the wafer and an associated wafer process history at the production tool.

In a further example of the fourth aspect and the above examples, the first and second data include critical dimension data and wherein the processing parameter includes an exposure parameter.

In another example of the fourth aspect and the above examples, the first and second data include overlay history data and wherein the processing parameter includes a position adjustment parameter.

In an additional example of the fourth aspect and the above examples, determining the processing parameter includes determining the processing parameter based at least in part on a regression of model parameters using the first or second data and utilizing a least absolute deviation objective function. For example, the regression is a slacked regression. In another example, the least absolute deviation objective function is a weighted least absolute deviation objective function. In a further example, the regression utilizes a model that is a function of time, the model parameters associated with the function of time. For example, the model is a linear model having an intercept, the intercept being a function of time.

In a further example of the fourth aspect and the above examples, determining whether sufficient first data is available includes querying a database and comparing the number of records returned as the first data with a threshold.

In another example of the fourth aspect and the above examples, determining whether sufficient second data is available includes querying a database and comparing the sum of the number of records in the first data and the number of records returned as the second data with a threshold.

In a fifth aspect, a semiconductor production system includes a production tool to receive a wafer, a database to store tool history data, and a controller in communication with the production tool and the database. The controller is to determine whether sufficient first data is available in the database, the first data associated with previously processed wafers process through the same process and processing pathway as the wafer, determine whether sufficient second data is available in the database based at least in part on determining whether sufficient first data is available, the second data associated with previously processed wafers processed through the same process and wherein the processing pathway of the previously processed wafers differ by one tool relative to the processing pathway associated with the wafer, determine a processing parameter of the production tool based on the first or second data, and initiate processing of the wafer in the production tool in accordance with the determined processing parameter.

While the above examples illustrate use of first degree polynomials in models, higher degree polynomials can be used. For example, model parameters for first degree, second degree, third degree or higher parameters can be regressed and utilized to determine processing parameters in the manner described above.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

As used herein, the terms "comprises," "comprising," "includes," "including," "has," "having" or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" are employed to describe elements and components described herein. This is done merely for convenience and to give a general sense of the scope of the invention. This description should be read to include one or at least one and the singular also includes the plural unless it is obvious that it is meant otherwise.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

After reading the specification, skilled artisans will appreciate that certain features are, for clarity, described herein in the context of separate embodiments, may also be provided in combination in a single embodiment. Conversely, various features that are, for brevity, described in the context of a single embodiment, may also be provided separately or in any subcombination. Further, references to values stated in ranges include each and every value within that range.

What is claimed is:

1. A method of processing a wafer comprising:
   receiving the wafer at a production tool, wherein the wafer is associated with a wafer process history;
   accessing a database to find data associated with previous wafers processed by the production tool with a same wafer process history, the data including records each associated with a wafer and at least one stored process parameter, wherein the accessing the database comprises querying the database and comparing a sum of a number of records associated with the previous wafers with the same wafer process history and a number of records associated with previously-stored data to a threshold wherein the comparing excludes one or more records having a value of a stored process parameter outside of an expected range, and wherein the expected range is based on at least one of a deviation relative to a mean, a deviation relative to a median, and a set percentile;
   determining, in response to the comparing meeting or exceeding the threshold, a process parameter using the data associated with the previous wafers with the same wafer process history;
   determining, in response to the comparing being below the threshold, the process parameter using the previously-stored data associated with the previous wafers processed by the production tool based on a regression of model parameters using the data associated with the previous wafers with the same wafer process history and that have a different wafer process history from the wafer process history by at least a single factor and by a least absolute deviation objective function; and
   processing the wafer with the production tool using the process parameter when a value of the process parameter exceeds a minimum amount relative to a previous value of the process parameter.

2. The method of claim 1, wherein the determining the process parameter using the previously-stored data comprises retrieving, the previously-stored data associated with the previous wafers processed by the production tool from the database, wherein the previously-stored data has a different wafer process history from the wafer process history by two factors.

3. The method of claim 1, wherein the determining the process parameter using the previously-stored data comprises retrieving, the previously-stored data associated with the previous wafers processed by the production tool from the database, wherein the different wafer process history is associated with a different process.

4. The method of claim 1, wherein the determining the process parameter using the previously-stored data comprises retrieving, the previously-stored data associated with the previous wafers from the database, wherein the different wafer process history is associated with a different production tool.

5. The method of claim 4, wherein the previous wafers processed by the different production tool have the same wafer process history.

6. The method of claim 1, wherein the data associated with the previous wafers with the same wafer process history and with previous wafers with the different process history comprises critical dimension data and wherein the process parameter comprises an exposure parameter.

7. The method of claim 1, wherein the data associated with the previous wafers with the same wafer process history and with previous wafers with the different process history comprises overlay history data and wherein the process parameter comprises a position adjustment parameter.

8. The method of claim 1, wherein the processing the wafer comprises using a previous value of the process parameter when a value of the process parameter is less than the minimum amount relative to the previous value of the process parameter.

9. The method of claim 1, wherein the regression is a slacked regression.

10. The method of claim 1, wherein the least absolute deviation objective function is a weighted least absolute deviation objective function.

11. The method of claim 1, wherein the regression utilizes a model that is a function of time, wherein the model parameters are associated with the function of time.

12. The method of claim 11, wherein the model is a linear model having an intercept, the intercept being a function of time.

13. A semiconductor production system comprising:
a production tool to receive a wafer associated with a wafer process history;
a database to store tool history data; and
a controller in communication with the production tool and the database, the controller configured to:
access a database to find data, wherein the data is associated with previous wafers processed by the production tool and associated with a same wafer process history, the data including records each associated with a wafer and at least one stored process parameter, wherein the access to the database comprises a query of the database and a comparison of a sum of records associated with the previous wafers with the same wafer process history and a number of records associated with previously-stored data to a threshold wherein the comparison excludes one or more records having a value of a stored process parameter outside of an expected range, and wherein the expected range is based on at least one of a deviation relative to a mean, a deviation relative to a median, and a set percentile;
determine, in response to the comparison meeting or exceeding the threshold, a process parameter using the retrieved data from the database associated with the previous wafers with the same wafer process history;
determine, in response to the comparison being below the threshold, the process parameter using the previously-stored data from the database associated with the previous wafers processed by the production tool based on a regression of model parameters using the data associated with the previous wafers with the same wafer process history and that have a different wafer process history from the wafer process history by at least a single factor and by a least absolute deviation objective function; and
initiate processing of the wafer in the production tool in accordance with the determined process parameter when a value of the determined process parameter exceeds a minimum amount relative to a previous value of the determined process parameter.

14. The semiconductor production system of claim 13, wherein the controller configured to determine, in response to the comparison being below the threshold, the process parameter using the previously-stored data is to, retrieve, the previously-stored data associated with the previous wafers processed by the production tool from the database, wherein the previously-stored data has a different wafer process history from the wafer process history by two factors.

15. The semiconductor production system of claim 13, wherein the controller configured to determine, in response to the comparison being below the threshold, the process parameter using the previously-stored data is to, retrieve, the previously-stored data associated with the previous wafers processed by the production tool from the database, wherein the different wafer process history is associated with a different process.

16. The semiconductor production system of claim 13, wherein the controller configured to determine, in response to the comparison being below the threshold, the process parameter using the previously-stored data is to, retrieve, the previously-stored data associated with the previous wafers from the database, wherein the different wafer process history is associated with a different production tool.

17. The semiconductor production system of claim 13, wherein the data associated with the previous wafers with the same wafer process history and with previous with the different process history comprises critical dimension data and wherein the process parameter comprises an exposure parameter.

18. A semiconductor device formed by a method comprising:
receiving a wafer at a production tool, wherein the wafer is associated with a wafer process history;
accessing a database to find data associated with previous wafers processed by the production tool with a same wafer process history, the data including records each associated with a wafer and at least one stored process parameter, wherein the accessing the database comprises querying the database and comparing a sum of a number of records associated with the previous wafers with the same wafer process history and a number of records associated with previously-stored data to a threshold wherein the comparing excludes one or more records having a value of a stored process parameter outside of an expected range, and wherein the expected range is based on at least one of a deviation relative to a mean, a deviation relative to a media, and a set percentile;
determining, in response to the comparing meeting or exceeding the threshold, a process parameter using the data associated with the previous wafers with the same wafer process history;
determining, in response to the comparing being below the threshold, the process parameter using the previously-stored data associated with the previous wafers processed by the production tool based on a regression of model parameters using the data associated with the previous wafers with the same wafer process history and that have a different wafer process history different from the wafer process history by at least a single factor and by a least absolute deviation objective function; and processing the wafer with the production tool using the process parameter when a value of the process parameter exceeds a minimum amount relative to a previous value of the process parameter.

\* \* \* \* \*